United States Patent [19]

Nakatani et al.

[11] Patent Number: 4,906,405

[45] Date of Patent: Mar. 6, 1990

[54] CONDUCTOR COMPOSITION AND METHOD OF MANUFACTURING A MULTILAYERED CERAMIC BODY USING THE COMPOSITION

[75] Inventors: Seiichi Nakatani, Hirakata; Tsutomu Nishimura, Uji; Satoru Yuhaku, Osaka; Minehiro Itagaki, Moriguchi, all of Japan

[73] Assignee: Matsushita Electric Industrial Co., Ltd., Osaka, Japan

[21] Appl. No.: 194,967

[22] Filed: May 17, 1988

[30] Foreign Application Priority Data

| May 19, 1987 | [JP] | Japan | 62-121912 |
| May 19, 1987 | [JP] | Japan | 62-121922 |
| May 22, 1987 | [JP] | Japan | 62-126266 |
| May 22, 1987 | [JP] | Japan | 62-126274 |

[51] Int. Cl.$^4$ .............................................. H01B 1/06
[52] U.S. Cl. .................................. 252/518; 106/1.23; 106/1.26
[58] Field of Search ............... 252/518, 512; 106/1.22, 106/1.23, 1.26, 1.25; 501/21, 22, 50, 51, 52, 73, 74, 75, 11, 17, 20; 156/89

[56] References Cited

U.S. PATENT DOCUMENTS

| 3,977,887 | 8/1976 | McIntosh . | |
| 4,072,775 | 2/1978 | Grier . | |
| 4,115,493 | 9/1978 | Sakabe . | |
| 4,172,919 | 10/1979 | Mitchell | 252/512 |
| 4,301,324 | 11/1981 | Kumar . | |
| 4,323,483 | 4/1982 | Rellick . | |
| 4,451,869 | 5/1984 | Sakabe . | |
| 4,695,403 | 9/1987 | Nishimura . | |
| 4,714,570 | 12/1987 | Nakatani et al. | 252/518 |

FOREIGN PATENT DOCUMENTS 61-26292  2/1986  Japan .

*Primary Examiner*—Josephine Barr
*Attorney, Agent, or Firm*—Wenderoth, Lind & Ponack

[57] ABSTRACT

Disclosed are a CuO conductor paste which is effective for making a multilayered ceramic body, the conductor material of which is made of copper, and a method of manufacturing a multilayered ceramic body using the conductor paste. The conductor paste is made of CuO as the main component with an addition of at least one of PbO-based glass, or any of $Bi_2O_3$-based glass, CuO-based glass and $CuAl_2O_4$ as the additive. The multilayered ceramic body is manufactured by a method comprising a forming process for making a multilayered body from the conductor paste and dielectric material, a binder removing process by heat treating the multilayered body, thus obtained, in air, a reduction process for reducing CuO to copper in a mixed gas atmosphere of hydrogen and nitrogen, and a sintering process for sintering the multilayered body thus reduced in a nitrogen gas atmosphere.

7 Claims, 3 Drawing Sheets

CONDUCTOR COMPOSITION AND METHOD OF MANUFACTURING A MULTILAYERED CERAMIC BODY USING THE COMPOSITION

BACKGROUND OF THE INVENTION

1. Field of the Invention

This invention relates to a conductor composition which is adapted to be applied for multilayered ceramic bodies typically represented by, for example, a multilayered ceramic substrate or a multilayered ceramic capacitor effective for rendering an electronic device small in size and light in weight, and a method of manufacturing a multilayered ceramic body using the composition.

2. Description of the Prior Art

Multilayered ceramic bodies and hybrid ICs have used for their conductor materials a noble metals such as Au, Pt, Pd and the like on a base metal such as W, Mo, Ni, Cu and the like.

The conductor pattern of the hybrid IC is formed in such a manner that an organic binder and a solvent are added to the above a metal to make a paste, the paste thus prepared is screen-printed on an insulation substrate made of, for example, alumina, and fired in a belt type furnace. In the case of the multilayered ceramic body, pasted ceramic or glass power is used as an insulating or dielectric material in addition to the conductor paste to make a multilayer structure through the screen printing process.

Also, another method is available which obtains a multilayered body by applying the above mentioned conductor paste on a green tape consisting of the above mentioned insulating powder and an organic binder in a laminating manner.

As metallic materials to be used in making multilayered ceramic bodies, Au, Ag and Pd can be advantageously fired in air, but are disadvantageously expensive because they are noble. On the contrary, W, Mo, Ni and Cu are all inexpensive because of the base metal, but it is necessary to subject them to a firing process under either a reduction atmosphere or under inert atmospheric conditions.

For the multilayered ceramic substrate, W and Mo have been generally well used. The firing process thereof, however, is carried out at a temperature as high as 1600° C. under a reducing atmosphere.

Thus, with the development on a substrate material which is low in cost, high in production capacity and possible to be fired at a low temperature, Cu is now being watched with keen interest as a conductor material capable of providing a low conductive resistance and higher reliability. U.S. Pat. Nos. 3,977,887 and 4,301,324 disclose developmental examples of low temperature firing substrates.

In addition, for the multilayered ceramic capacitor, Pd has been used as the conductor material, but it is also disadvantageously expensive, so that such a method has been proposed that the dielectric body is fired at a low temperature and Ag, an inexpensive metal, is used substitutionally with a part of the Pd, or Ni is used as the conductor material. (See, for example, U.S. Pat. Nos. 4,115,493 and 4,451,869.)

However, Ni or Cu, which is a base metal, has such disadvantages that the firing cannot be carried out in air and that the nitrogen gas atmosphere during firing must be carefully controlled since the properties, such as adhesion to the material to be metalized, sheet resistance, solderability, and so on, and the dissolution of the organic binder contained in the paste must be considered at the same time. Namely, with the copper electrode, the low oxygen partial pressure of the nitrogen gas atmosphere cannot cause the dissolution of the organic binder to take place but allows it to remain in a carbonic form, which badly effects metallization. Inversely, if the oxygen partial pressure is high, the copper electrode will be oxidized.

Thus, it is required to control the oxygen partial pressure sophisticated manner, which makes it unsuitable to meet mass production requirements.

Thus, considering the fact that the use of a base metal such as Cu and Ni in the oxide form makes it possible to achieve complete removal of the organic binder in air, we have developed a new method effectively achieving both the binder removal and the copper metallization. In this method, a multilayered body is formed by using a conductor paste containing either CuO or NiO as the main component, the binder removal is carried out through heat treatment in air, and then the oxide is reduced to metal in a reduction atmosphere containing a hydrogen gas, followed by a final firing process under a nitrogen gas atmosphere. The method is disclosed in U.S. Pat. Nos. 4,695,403 and 4,714,570 and the U.S. Pat. application Ser. No. 018,579.

The method we developed offers many advantages in that the binder removal can be achieved completely, the atmosphere during firing can be easily controlled and further, the paste uses a stable oxide as the starting material. We must, however, indicate here that there exists a point to be improved. That is, when CuO is used as the original material, since the reduction process is carried out, as an intermediate step of the manufacturing method can produce a pure copper, reactivity with a material to be metalized reduces, so that an adequate adhesion strength is not obtained.

Therefore, we have adopted a method in which $Bi_2O_3$, CdO, $MnO_2$ or the like is used as the additive to the CuO paste in order to increase the adhesion strength. However, adequate adhesion strength is sometimes unobtainable when the firing temperature body is low, or when firing is required to be achieved in a short period of time.

SUMMARY OF THE INVENTION

An object of this invention is to provide a CuO paste composition which is effectively used in making a conductor material of a multilayered ceramic body and a method of manufacturing a multilayered ceramic body using the conductor composition.

Another object of this invention is to provide a conductor composition which is adapted to be used for a multilayered ceramic body which is possible to be fired at a low temperature.

In order to attain these objects, a conductor composition in accordance with this invention comprises an inorganic component containing CuO as a main constituent and at least one of PbO-based glass, CuO-based glass, $Bi_2O_3$-based glass and $CuAl_2O_4$ as an additive, and an organic vehicle. A method of manufacturing a multilayered ceramic body in accordance with this invention comprises a forming process of producing a multilayered body using the above conductive composition and a ceramic material, a binder removing process for burning-out a binder through heat treatment in air, a reduction process for reducing CuO to copper through heat treatment in a reductive atmosphere (for example, in a $N_2+H_2$ gas atmosphere), and a firing process in which the multilayered body, thus formed is fired under neutral atmospheric conditions.

The conductor composition having CuO as the main component with a small amount of additive, makes it possible to provide a remarkable increase in the adhesion strength, and further makes it possible to carry out the firing process at a low temperature for a short time.

DETAILED DESCRIPTION OF THE INVENTION

Figure 1:
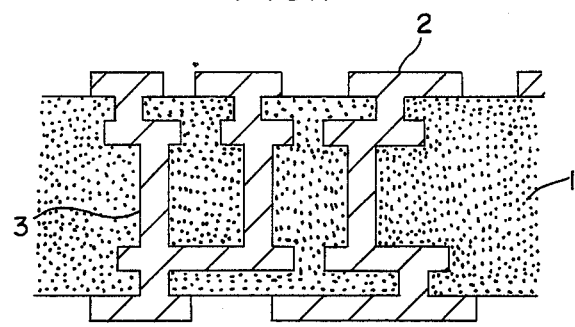
FIG. 1 is a sectional view of an embodiment of a ceramic laminate body of this invention.

FIG. 1 is a sectional view of an embodiment of a multilayered ceramic body for which a conductor composition of this invention is applied.

In FIG. 1, reference numerals 1, 2 and 3 indicate a substrate material which is made of ceramic and/or glass and which can be fired at low temperatures, a top conductor layer and an inner conductor layer, respectively.

An essential factor in making the multilayered ceramic body shown in FIG. 1 is how a strong adhesion can be obtained between the conductor having CuO as the main component and a ceramic material on which the metallization is made.

According to the manufacturing method of this invention, a multilayered body is formed by using CuO as the main component of the starting material for the conductor material and a ceramic material as the dielectric body.

Next, the multilayered body thus formed is subjected to a heat treatment in an oxygen gas or in air to remove the organic binder contained therein, and then the reduction of CuO is carried out through a heat treatment in a mixed gas atmosphere of hydrogen and nitrogen, followed by co-firing the copper layer thus obtained and the ceramic material in a nitrogen gas atmosphere.

Thus, CuO used as the starting material of the conductor material is completely reduced to copper through the reduction process. In this case, the nonexistence of CuO or $Cu_2O$, which can be expected to provide the adhesion by the reaction during the firing process, results in the wettability between the ceramic material and the copper electrode becoming poor, thus causing them not only to be non-adhesive but also causing the inner copper layer to delaminate or the electrode to peel.

As a measure to cope with this, the prior art has adopted such a method that the binder removal temperature is increased to react the CuO with the ceramic material in advance, and in the successive reduction process the reduction is made while partially maintaining the CuO reaction layer. With this method, however, the adhesion strength of the copper layer is disadvantageously delicately affected by the reduction condition.

In order to solve this problem, this invention adds a new additive to CuO. First, when PbO-based glass, CuO-based glass or $Bi_2O_2$-based glass is added to CuO as the additive, even if CuO is completely reduced to copper as described above, the additive allows the adhesion between the ceramic material and copper particles during firing to obtain a highly reliable metallization. Therefore, the reduction and firing conditions can be easily controlled. Although, the addition of a glass frit makes it possible to expect the adhesion between CuO and the ceramic material to a certain degree even in the binder removal process, an excess amount of glass frit results in a failure of the successive reduction process because the CuO particle surface is covered with the glass frit.

On the other hand, with the conventional CuO composition, when the oxygen partial pressure is increased during firing, copper is oxidized to form a CuO layer. Thus, the solderability reduces and the sheet resistance increases. However, when a glass frit is added as in this invention, the glass frit absorbs the CuO or $Cu_2O$ layer formed on the copper surface, thus making obtainable, the formation of a highly reliable metalized layer.

Next, the case in which $CuAl_2O_4$ is used as the additive will be described. Generally, the mechanism of the adhesion between the copper layer and ceramic is considered as follows:

When the copper particles and the ceramic material are to be adhered through the heat treatment in a nitrogen gas atmosphere, the presence of CuO or $Cu_2O$ plays a great role on the adhesion. This is because the copper particles and the ceramic do not become wet in the nitrogen gas atmosphere and the adhesion reaction takes place between them only when CuO exists. For this reason, the conventional copper paste has adopted such a method that the copper particles have their surfaces partially oxidized, or CuO is added to the copper paste in advance, or the like. In this case, CuO or $Cu_2O$ forms a $CuAl_2O_4$ layer on an alumina substrate thereby to enhance the adhesion strength. Therefore, the use of $CuAl_2O_4$ as the additive makes it possible to provide an adequate effect on the adhesion properties when added in a small amount.

Figure 2:
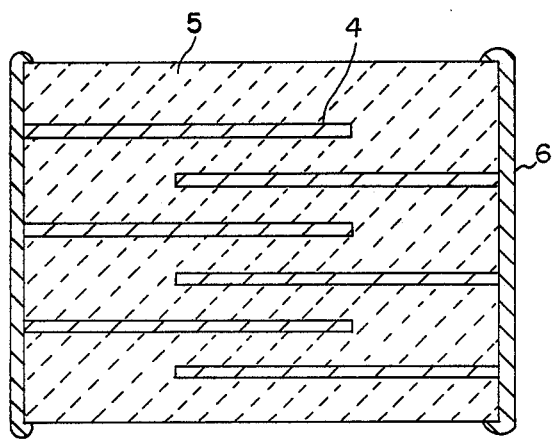
FIG. 2 is a sectional view of a modified embodiment of a ceramic laminated body of this invention.

FIG. 2 is a sectional view of an example of a multilayered ceramic capacitor for which the conductor composition in accordance with this invention is applied. Referring to FIG. 2, reference numerals 4, 5 and 6 indicate an inner copper electrode, a dielectric layer and a terminal electrode, respectively.

EXAMPLE 1

First, the method of manufacturing a glass frit to be used with a CuO paste of this invention will be explained. Powdered raw materials for making the glass composition of this invention were suitably mixed with each other in advance, placed into a Pt-crucible, and heated at a temperature of 1500° C. After it was completely melted, it was dropped into water thereby to rapidly cool it, whereby a lump of glass was obtained. Then, the glass lump, after being dried, was pulverized by using a ball-mill. In this case, methanol was used as the solvent and $ZrO_2$ balls were used for balls of the mill. The pulverization was continued for a time period of 24 hours. As the result, a powdered glass material having a particle size of about 2 μm in average was obtained.

The compositions, softening points and particle sizes of glass frits obtained are shown in Table 1.

TABLE 1

| No. | \multicolumn{9}{c|}{Glass composition} | Property of glass | |
|---|---|---|---|---|---|---|---|---|---|---|---|
| | PbO | B$_2$O$_3$ | SiO$_2$ | CaO | Al$_2$O$_3$ | MgO | ZrO$_2$ | Y$_2$O$_3$ | SrO | softening point °C. | Average particle size (μm) |
| G-1 | 39 | 20 | 20 | 16 | 5 | — | — | — | — | 668 | 1.66 |
| G-2 | 55 | 20 | 15 | 5 | 5 | — | — | — | — | 530 | 1.25 |
| G-3 | 65 | 15 | 15 | 3 | 2 | — | — | — | — | 489 | 1.66 |
| G-4 | 70 | 10 | 10 | 5 | 5 | — | — | — | — | 443 | 1.51 |
| G-5 | 80 | 5 | 5 | 5 | 5 | — | — | — | — | 433 | 1.95 |
| G-6 | 20 | 30 | 20 | 10 | 10 | 5 | 5 | — | — | 525 | 2.05 |
| G-7 | 5 | 30 | 30 | 20 | 10 | 5 | — | — | — | 610 | 1.98 |
| G-8 | 44 | 20 | 20 | 8 | 5 | 3 | — | — | — | 603 | 1.61 |
| G-9 | 44 | 20 | 18 | 8 | 5 | 5 | — | — | — | 525 | 1.65 |
| G-10 | 40 | 20 | 21 | 8 | 5 | 3 | 3 | — | — | 543 | 1.55 |
| G-11 | 40 | 20 | 19 | 8 | 5 | 3 | 5 | — | — | 496 | 2.65 |
| G-12 | 40 | 20 | 23 | 5 | 5 | 3 | 3 | 1 | — | 506 | 1.73 |
| G-13 | 40 | 20 | 21 | 5 | 5 | 3 | 3 | 3 | — | 601 | 2.05 |
| G-14 | 50 | 20 | 16 | 5 | 5 | — | 3 | — | 1 | 441 | 1.99 |
| G-15 | 48 | 20 | 16 | 5 | 5 | — | 3 | — | 3 | 463 | 1.76 |
| G-16 | 50 | 20 | 16 | 5 | 5 | 3 | — | — | 1 | 405 | 1.54 |
| G-17 | 48 | 20 | 16 | 5 | 5 | 3 | — | — | 3 | 421 | 1.39 |
| G-18 | 54 | 20 | 12 | 5 | 5 | 1 | 1 | 1 | 1 | 446 | 2.15 |
| G-19 | 46 | 20 | 12 | 5 | 5 | 3 | 3 | 3 | 3 | 481 | 2.03 |

Figure 4:
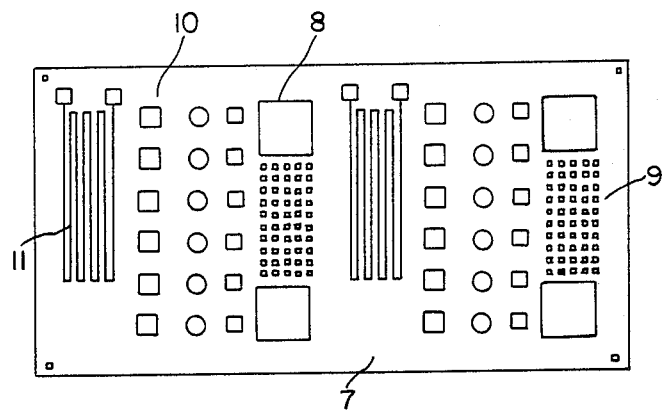
FIG. 4 is a top view showing a substrate for measuring adhesion strength and solderability manufactured by using the conductor composition according to this invention.

Next, the method of manufacturing the CuO paste will be explained. Powdered CuO having an average grain size of 2.5 μm was used. It was mixed with each of the above mentioned glass frits to make an inorganic composition. Next, an organic vehicle composition was prepared in such a manner that ethylcellulose to be used as the organic binder was dissolved with turpentine oil as the solvent. The vehicle composition thus prepared was kneaded with the inorganic composition in a 3-stage roll to obtain a CuO paste. The CuO paste thus obtained was printed on an alumina substrate (96% Al$_2$O$_3$) by the screen printing method in a pattern as shown in FIG. 4. The thickness of the printed films was about 20 μm. In FIG. 4, reference numerals 7 and 8 indicate an alumina substrate and a CuO paste conductor pattern, respectively.

Next, in order to evaluate the metallization of the CuO paste on a multilayered substrate, the same conductor pattern as shown in FIG. 4 was formed on a green tape made of glass and ceramic for comparison purposes. This glass-ceramic dielectric material was made in a tape form by the doctor blade method using a mixture of a lead borosilicate base glass (Corning's #7056) and alumina powder (at a weight ratio of 1:1) with an addition of an organic binder, plasticizer and solvent. This tape will hereinafter be referred to as a dielectric layer.

Next, after the formation of the conductor pattern, each of the samples was fired. The firing profile is shown in FIG. 3.

Figure 3:
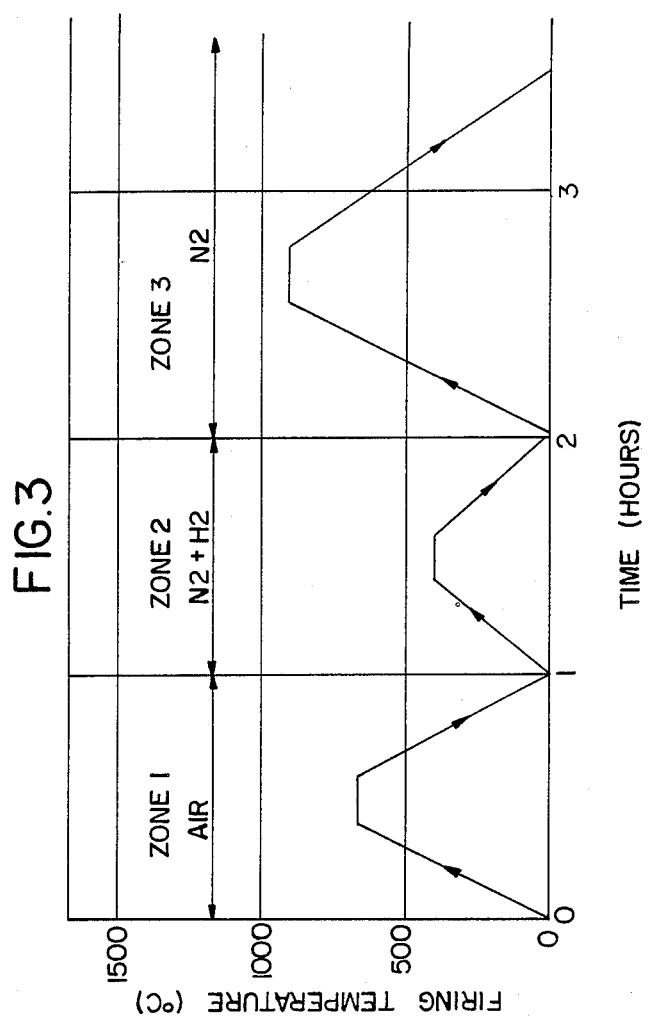
FIG. 3 is a graph exemplary of the temperature and atmosphere profile of the binder removing process, reduction process and sintering process in the manufacturing method of this invention.

First, the binder removal was carried out at 500° C. in air as shown in Zone 1 of FIG. 3. The conductor paste having CuO as the main component caused no unnecessary reactions but the removal of the organic binder and no change in volume.

The sample after the binder removal process was heated at about 300° C. in a nitrogen gas atmosphere containing hydrogen gas at 20% to carry out the reduction of CuO to copper (See Zone 2). Finally, it was fired at 900° C. in a nitrogen gas atmosphere (See Zone 3).

Next, the method of evaluating the copper-metallized substrate and dielectric layer after firing will be explained. The evaluation of copper metallization was made, based on the solderability, adhesion strength of the copper and sheet resistance of the conductor.

The solderability was checked in such a manner that a copper electrode was wetted appropriately with a flux using an injector to dip into a binder dipping bath held at 230° C. for about ten seconds and the area where the solder was accepted, which is shown at 9 of FIG. 4, was evaluated on a five-grade evaluation basis. In this case, the five-grade evaluation is shown as follows:

The solder acceptance area below 20% is evaluated at 1, that of 20 to 40% at 2, that of 40 to 60% at 3, that of 60 to 80% at 4 and that of 80 to 100% at 5. Since almost all of them were evaluated at 4 or more, they are all sufficiently usable.

The adhesion strength was checked in such a manner that an L-shaped lead of 0.8 mm in diameter was soldered to an electrode pattern of 2 mm square shown at 10 FIG. 4, and a tension was applied to the lead, thus soldered, using a tensile tester, thereby to measure the tensile strength at which a fracture occurs between the lead and substrate.

The sheet resistance was obtained using a pattern shown at 11 of FIG. 4. Table 2 shows the addition amounts of the above mentioned powdered glass to the CuO and evaluated results of the copper metallization. From Table 2, it can be cleared that as the softening point of a glass frit becomes small, the metallization property becomes better. However, if PbO is used in excessive amounts a trend to decrease the solderability exists. This is considered for the reason that if the softening point becomes excessively low, a reaction takes place with the dielectric material to soften it, resulting in an elusion of the electrode surface.

Also, it was found that addition of Y$_2$O$_3$ can improve the solderability. From the viewpoint of adhesion strength, the addition of SrO offers a particular advantage when compared with others having the same softening point.

Next, examination results on the optimum amount of glass frit to be added using the G-18 glass frit are shown in Table 3.

TABLE 2

Evaluation results of copper oxide paste composition and copper metallization

| No. | Glass NO | Amount (Wt %) | CuO (Wt %) | Adhesion strength On alumina kg/2 mm□ | On dielectric kg/2 mm□ | * Solder-ability |
|---|---|---|---|---|---|---|
| 1 | G-1 | 3 | 97 | 0.55 | 0.88 | 4 |
| 2 | G-2 | 3 | 97 | 1.02 | 1.62 | 4 |
| 3 | G-3 | 3 | 97 | 1.20 | 1.85 | 3 |
| 4 | G-4 | 3 | 97 | 1.43 | 2.20 | 2 |
| 5 | G-5 | 3 | 97 | 1.34 | 2.12 | 1 |
| 6 | G-6 | 3 | 97 | 1.01 | 1.71 | 4 |
| 7 | G-7 | 3 | 97 | 0.78 | 1.25 | 4 |
| 8 | G-8 | 3 | 97 | 1.15 | 1.62 | 4 |
| 9 | G-9 | 3 | 97 | 1.10 | 1.98 | 4 |
| 10 | G-10 | 3 | 97 | 1.07 | 1.65 | 4 |
| 11 | G-11 | 3 | 97 | 1.14 | 1.80 | 4 |
| 12 | G-12 | 3 | 97 | 0.78 | 1.21 | 5 |
| 13 | G-13 | 3 | 97 | 0.77 | 1.35 | 5 |
| 14 | G-14 | 3 | 97 | 1.55 | 2.45 | 4 |
| 15 | G-15 | 3 | 97 | 1.56 | 2.31 | 4 |
| 16 | G-16 | 3 | 97 | 1.77 | 2.59 | 4 |
| 17 | G-17 | 3 | 97 | 1.71 | 2.51 | 4 |
| 18 | G-18 | 3 | 97 | 1.57 | 2.31 | 5 |
| 19 | G-19 | 3 | 97 | 1.44 | 2.26 | 5 |

*Solderability was evaluated only on the dielectric layer

TABLE 3

Consideration on amounts of glass frit to be added

| No. | Glass NO | Amount (Wt %) | CuO (Wt %) | Adhesion strength On alumina kg/2 mm□ | On dielectric kg/2 mm□ | * Solderability | Sheet resistance mΩ/□ |
|---|---|---|---|---|---|---|---|
| 20 | G-18 | 0 | 100 | — | — | — | — |
| 21 | G-18 | 0.1 | 99.9 | — | — | — | — |
| 22 | G-18 | 0.5 | 99.5 | 0.57 | 0.15 | 5 | 3.05 |
| 23 | G-18 | 1 | 99 | 1.21 | 1.98 | 5 | 3.55 |
| 24 | G-18 | 3 | 97 | 1.57 | 2.31 | 4.5 | 4.13 |
| 25 | G-18 | 5 | 95 | 1.61 | 2.15 | 3 | 5.08 |
| 26 | G-18 | 10 | 90 | 1.75 | 2.53 | 2 | 10.3 |
| 27 | G-18 | 15 | 85 | 1.11 | 1.55 | 2 | 25.6 |
| 28 | G-18 | 20 | 80 | 0.53 | 1.25 | 1 | 55.3 |

*Solderability shows evaluations on the dielectric layer

It can be clearly seen from Table 3 that the adhesion strength is improved when the glass frit is at an amount of about 0.5 to 15 wt. %. However, upon consideration of the solderability, an addition of 1.0 to 5.0 wt. % is preferable Also, the adhesion is stronger on the dielectric layer than on the alumina substrate. This is considered to be caused by the fact that the alumina substrate has a fine and flat surface and the co-firing with the electrode take place on the dielectric layer thereby to make it reactive.

In addition, when the glass frit is used in an amount below 0.1 wt. %, the adhesion could not be evaluated because it is peeled off during firing.

Further, when the glass frit is used in additional amounts of over 10 wt. %, higher sheet resistances resulted, thus making them practically unusable.

EXAMPLE 2

Table 4 shows the composition, softening point and average particle size of each glass frit used in this EXAMPLE. The manufacturing method was in the same manner as in EXAMPLE 1. Also, the copper oxide paste to be used was manufactured and evaluated in the same manner as in EXAMPLE 1. The CuO paste composition to be used in this EXAMPLE and its copper metallization property were evaluated as shown in Table 5.

Also, the additional amount of the CuO paste and copper metallization property when G-35 glass frit was used were evaluated as shown in Table 6.

TABLE 4

| | Glass composition | | | | | | | | | | Property of glass | |
|---|---|---|---|---|---|---|---|---|---|---|---|---|
| No. | $Bi_2O_3$ | PbO | $B_2O_3$ | $SiO_2$ | CaO | $Al_2O_3$ | MgO | $ZrO_2$ | $Y_2O_3$ | SrO | softening point °C. | Average particle size (μm) |
| G-20 | 44 | 18 | 10 | 15 | 5 | 8 | — | — | — | — | 535 | 1.6 |
| G-21 | 50 | 12 | 10 | 15 | 5 | 8 | — | — | — | — | 473 | 1.9 |
| G-22 | 61 | 12 | 5 | 9 | 5 | 8 | — | — | — | — | 409 | 2.2 |
| G-23 | 71 | 12 | 5 | 4 | 5 | 3 | — | — | — | — | 385 | 2.4 |
| G-24 | 24 | 30 | 20 | 15 | 5 | 6 | — | — | — | — | 556 | 1.8 |
| G-25 | — | 40 | 20 | 25 | 5 | 5 | 5 | — | — | — | 650 | 1.8 |
| G-26 | 41 | 24 | 10 | 15 | 5 | 5 | — | — | — | — | 505 | 1.7 |
| G-27 | 41 | 24 | 9 | 15 | 5 | 5 | 1 | — | — | — | 512 | 2.1 |
| G-28 | 41 | 24 | 7 | 15 | 5 | 5 | 3 | — | — | — | 533 | 2.4 |
| G-29 | 41 | 24 | 9 | 15 | 5 | 5 | — | 1 | — | — | 516 | 2.3 |
| G-30 | 41 | 24 | 7 | 15 | 5 | 5 | — | 3 | — | — | 509 | 2.2 |
| G-31 | 41 | 24 | 8 | 15 | 5 | 5 | 1 | — | 1 | — | 565 | 1.7 |
| G-32 | 41 | 24 | 6 | 10 | 5 | 5 | 1 | — | 3 | — | 553 | 1.6 |
| G-33 | 41 | 24 | 13 | 10 | 5 | 5 | — | 1 | — | 1 | 503 | 1.9 |
| G-34 | 41 | 24 | 11 | 10 | 5 | 5 | — | 1 | — | 3 | 491 | 2.5 |
| G-35 | 41 | 24 | 11 | 10 | 5 | 5 | 1 | 1 | 1 | 1 | 551 | 3.1 |

TABLE 5

Evaluation results of copper oxide paste and copper metallization

| | Glass frit | | | On alumina | On dielectric | | |
|---|---|---|---|---|---|---|---|
| | | | | Adhesion | Adhesion | Sheet | |
| | Glass | Amount | CuO | strength | strength | resistance | |
| No. | NO | (Wt %) | (Wt %) | kg/2 mm² | kg/2 mm² | mΩ/⁵⁸ | Solderability |
| 29 | G-20 | 3 | 97 | 1.69 | 2.14 | 3.45 | 4.5 |
| 30 | G-21 | 3 | 97 | 1.87 | 2.30 | 3.01 | 4.5 |
| 31 | G-22 | 3 | 97 | 2.02 | 2.46 | 2.68 | 5 |
| 32 | G-23 | 3 | 97 | 2.06 | 2.50 | 3.55 | 4.5 |
| 33 | G-24 | 3 | 97 | 1.66 | 2.10 | 4.36 | 5 |
| 34 | G-25 | 3 | 97 | 1.40 | 1.83 | 3.68 | 3 |
| 35 | G-26 | 3 | 97 | 1.80 | 2.03 | 2.98 | 4.5 |
| 36 | G-27 | 3 | 97 | 1.74 | 1.88 | 3.33 | 4.5 |
| 37 | G-28 | 3 | 97 | 1.61 | 1.58 | 5.11 | 3 |
| 38 | G-29 | 3 | 97 | 1.35 | 1.76 | 4.35 | 3 |
| 39 | G-30 | 3 | 97 | 1.26 | 1.98 | 3.54 | 4 |
| 40 | G-31 | 3 | 97 | 1.77 | 2.11 | 3.11 | 4.5 |
| 41 | G-32 | 3 | 97 | 2.03 | 2.56 | 3.76 | 4.5 |
| 42 | G-33 | 3 | 97 | 2.15 | 2.35 | 4.03 | 4.5 |
| 43 | G-34 | 3 | 97 | 1.35 | 2.11 | 2.99 | 4.5 |
| 44 | G-35 | 3 | 97 | 2.00 | 2.06 | 3.01 | 4.5 |

TABLE 6

Evaluation results of glass frit addition and copper metallization

| | Glass frit | | | On alumina | On dielectric | | |
|---|---|---|---|---|---|---|---|
| | | | | Adhesion | Adhesion | Sheet | |
| | Glass | Amount | CuO | strength | strength | resistance | |
| No. | NO. | (Wt %) | (wt %) | kg/2 mm² | kg/2 mm² | mΩ/² | Solderability |
| 45 | Nil | 0 | 100 | *— | — | — | — |
| 46 | G-35 | 0.1 | 99.9 | — | — | — | — |
| 47 | G-35 | 0.5 | 99.5 | 0.56 | 1.10 | 2.35 | 5 |
| 48 | G-35 | 1.0 | 99 | 0.62 | 1.31 | 2.55 | 5 |
| 49 | G-35 | 3.0 | 97 | 2.00 | 2.06 | 3.01 | 4.5 |
| 50 | G-35 | 5.0 | 95 | 2.22 | 2.13 | 4.05 | 4 |
| 51 | G-35 | 10.0 | 90 | 2.08 | 2.35 | 5.03 | 3 |
| 52 | G-35 | 15.0 | 85 | 1.70 | 1.88 | 8.11 | 3 |
| 53 | G-35 | 20.0 | 80 | 1.08 | 1.95 | 15.00 | 2 |
| 54 | G-35 | 25.0 | 75 | 0.66 | 2.03 | 30.16 | 1 |

*Evaluation could not be made due to peeling of electrode.

From the above results, it can be clearly seen that a glass frit containing $Bi_2O_3$ exerts an advantageous effect on the copper metallization.

When $Bi_2O_3$ was added in small amounts, the softening point was increased, and when it was used at an additional amount of 70 wt. % or more, an unnecessary reaction took place on the dielectric layer or the alumina substrate to generate a diffusion to color it yellow, which is disadvantageous. Also, the solderability was improved as a whole when a glass frit containing $Bi_2O_3$ was used.

The addition of SrO improved the adhesion without increasing the sheet resistance greatly. For the evaluation of the amount of the glass frit, the examination results obtained by using the G-35 glass are given in Table 6. From Table 6, when the glass frit is added at least about 0.5 wt. %, the metallization property can be seen to be improved, particularly in respect to adhesion strength.

In addition, the solderability is lowered when the glass frit is added at 15 wt. % or more, but it can be evaluated to be good as a whole, which is considered to be due to the effect of $Bi_2O_3$. When considered from the aspect of the sheet resistance, the optimum range for addition will be 1 to 5 wt. %.

Though not shown here, the single addition of $Bi_2O_3$ to the CuO paste exhibited an improvement in the adhesion strength, but small as compared with its effect when used as the glass frit.

EXAMPLE 3

As shown in Table 7, this EXAMPLE used a CuO paste which was prepared in such a manner that an organic vehicle which was manufactured by dissolving polyvinyl butyral to be used as the organic binder with turpentine oil was added to a powdered inorganic composition using a glass containing a copper oxide as the additive, and the mixture thus obtained was kneaded by using a 3-stage roll so as to provide an appropriate biscosity. Here, the glass to be used as the additive to the CuO paste was prepared in such a manner that a glass shown in FIG. 8 and $Cu_2O$ of a specified amount were mixed with each other, the mixture thus obtained was heated to melt at 1300° C. using a glass melting furnace in air, and the melt thus obtained was rapidly cooled, followed by being powdered in a ball-mill.

TABLE 7

Evaluation results of CuO paste composition and copper metallization

| CuO Paste Lot No. | CuO (wt %) | Glass (wt %) | CuO contents of glass (wt %) | Adhesion strength (kg/mm) On 96Al₂O₃ | Adhesion strength (kg/mm) On dielectric | Solderability |
|---|---|---|---|---|---|---|
| 55 | 100 | 0 | | 0.35 | 0.39 | 5 |
| 56 | 99 | 1 | | 0.45 | 0.52 | 5 |
| 57 | 95 | 5 | 0 | 0.77 | 0.68 | 3 |
| 58 | 90 | 10 | | 0.82 | 0.75 | 1 |
| 59 | 85 | 15 | | 0.76 | 0.66 | 1 |
| 60 | 99 | 1 | | 1.02 | 1.11 | 5 |
| 61 | 95 | 5 | | 1.18 | 1.20 | 4 |

TABLE 7-continued

Evaluation results of CuO paste composition and copper metallization

| CuO Paste Lot No. | CuO (wt %) | Glass (wt %) | CuO contents of glass (wt %) | Adhesion strength (kg/mm) On 96Al2O3 | On dielectric | Solderability |
|---|---|---|---|---|---|---|
| 62 | 90 | 10 | 1 | 1.31 | 1.28 | 3 |
| 63 | 85 | 15 |   | 1.22 | 1.24 | 1 |
| 64 | 80 | 20 |   | 1.02 | 1.00 | 1 |
| 65 | 99 | 1 |   | 1.22 | 1.29 | 5 |
| 66 | 95 | 5 |   | 1.55 | 1.62 | 4 |
| 67 | 90 | 10 | 10 | 1.48 | 1.57 | 3 |
| 68 | 85 | 15 |   | 1.33 | 1.61 | 1 |
| 69 | 80 | 20 |   | 1.15 | 1.09 | 1 |
| 70 | 99 | 1 |   | 1.18 | 1.16 | 5 |
| 71 | 95 | 5 |   | 1.71 | 1.88 | 5 |
| 72 | 90 | 10 | 20 | 1.67 | 1.59 | 4 |
| 73 | 85 | 15 |   | 1.63 | 1.68 | 3 |
| 74 | 80 | 20 |   | 1.21 | 1.18 | 2 |
| 75 | 99 | 1 |   | 1.00 | 1.21 | 5 |
| 76 | 95 | 5 |   | 1.80 | 1.79 | 5 |
| 77 | 90 | 10 | 30 | 1.70 | 1.68 | 4 |
| 78 | 85 | 15 |   | 1.75 | 1.81 | 4 |
| 79 | 80 | 20 |   | 1.22 | 1.20 | 2 |

Next, the dielectric substrate material to be used in this EXAMPLE was evaluated in the same manner as in the case of EXAMPLE 1 on the substrate material shown in Table 9 and on the alumina substrate for the comparison purpose.

TABLE 8

| Glass lot | Glass composition | | | | | |
|---|---|---|---|---|---|---|
|   | SiO2 | Al2O3 | CaO | BaO | B2O3 | PbO |
| G-36 | 40 | 10 | 5 | 15 | 10 | 20 |

TABLE 9

| Dielectric substrate material composition | | | | | | | |
|---|---|---|---|---|---|---|---|
| Ceramic | Glass composition | | | | | | |
| Al2O3 | SiO2 | Al2O3 | CaO | BaO | B2O3 | PbO | |
| ML-1 | 50 | 20 | 5 | 2.5 | 2.5 | 5 | 15 (wt %) |

The printing of the CuO paste on the substrate, the firing condition and evaluation method were carried out in the same manner as in EXAMPLE 1. Table 7 shows specimens and evaluation results obtained by the method mentioned above. As clearly seen from the table, when a paste made of CuO only or a CuO paste having a glass not containing a copper oxide as the additive was used, the adhesion strength was almost unobtainable on both the alumina substrate and the dielectric layer. When a glass containing the copper oxide was added, however, it was largely improved with a small amount of its addition.

Also, the solderability was lowered with an increase in the addition amount of the glass. In this case, however, the adhesion strength was suitably obtainable even for specimens low in solderability, thus being sufficiently useful for an inner electrode of a copper multi-layered interconnection ceramic substrate. In addition, this EXAMPLE used a lead boro-silicate glass, but not limited to it.

EXAMPLE 4

The CuO paste of this EXAMPLE was made of a powdered inorganic composition having a powdered CuO as the main component and CuAl2O4 as the additive as shown in Table 10. Substrates were manufactured for the evaluation purpose in the same manner as in EXAMPLE 1 using this paste composition.

TABLE 10

| CuO paste composition | | |
|---|---|---|
| Inorganic paste composition Paste lot No. | CuO (wt %) | CuAl2O4 (wt %) |
| 80 | 100 | 0 |
| 81 | 99.5 | 0.5 |
| 82 | 99.0 | 1.0 |
| 83 | 98.0 | 2.0 |
| 84 | 95.0 | 5.0 |
| 85 | 92.5 | 7.5 |
| 86 | 90.0 | 10.0 |
| 87 | 85.0 | 15.0 |
| 88 | 80.0 | 20.0 |

The CuAl2O4 to be used in this EXAMPLE was manufactured in such a manner that an equimolar mixture of CuO and Al2O3 was heat-treated at 900° C. in an oxygen gas atmosphere for three hours, and the mixture thus treated was pulverized using an agate mortar.

The paste compositions and evaluation results of their metallization properties are shown in Table 11.

TABLE 11

| Evaluation result of metallization | | | |
|---|---|---|---|
| Substrate | Property CuO paste | Adhesion strength (kg/mm2) | Solderability |
| On alumina | 80 | 0.36 | 5 |
|  | 81 | 1.42 | 4.5 |
|  | 82 | 1.79 | 4.5 |
|  | 83 | 1.82 | 4 |
|  | 84 | 1.92 | 4 |
|  | 85 | 1.88 | 3 |
|  | 86 | 1.79 | 3 |
|  | 87 | 1.91 | 3 |
|  | 88 | 1.71 | 2 |
| On dielectric | 80 | 0.45 | 5 |
|  | 81 | 1.57 | 5 |
|  | 82 | 1.88 | 4 |
|  | 83 | 2.00 | 4 |
|  | 84 | 2.02 | 3.5 |
|  | 85 | 1.95 | 3 |
|  | 86 | 1.99 | 3 |
|  | 87 | 1.89 | 3 |
|  | 88 | 2.00 | 2 |

As clearly seen in Table 11, the addition of CuAl2O4 only in amounts of 0.5 wt. % leads to a rapid increase in the adhesion strength. When it was added at 5 wt. %, the adhesion was maximized, and as it is increased up to 20 wt. %, it was slightly decreased, but able to provide an adequate strength of adhesion. Also, the solderability was excellent up to 5 wt. % of addition amount of CuAl2O4, and when it was added up to 15 wt. % it was within the practically usable range. However, when added in amounts of 20 wt. % or more, the solderability was not good.

As a result, CuAl2O4 can be practically added in amounts ranging from 0.5 to 15 wt.% and when added at 5 wt. %, it is optimized. Table 12 shows the results obtained when only Al2O3 was added to the CuO paste for comparison purposes. From this, it can be recognized to be effective that the additive is used in the CuAl2O4 form.

TABLE 12

Effect of Al$_2$O$_3$ addition to the CuO paste

| Substrate | CuO paste composition (wt %) | | strength Kg/mm$^2$ | Adhesion Solderability |
|---|---|---|---|---|
| | CuO | Al$_2$O$_3$ | | |
| On alumina | 100 | 0 | 0.36 | 5 |
| | 99 | 1 | 0.52 | 5 |
| | 97 | 3 | 0.57 | 4.5 |
| | 95 | 5 | 0.66 | 3 |
| | 90 | 10 | 0.78 | 2 |
| On dielectric | 100 | 0 | 0.45 | 5 |
| | 99 | 1 | 0.60 | 4.5 |
| | 97 | 3 | 0.59 | 4 |
| | 95 | 5 | 0.82 | 4 |
| | 90 | 10 | 0.77 | 2 |

EXAMPLE 5

We manufactured a multilayered ceramic capacitor (MLC) structured as shown in FIG. 2. Details will be described below. For the dielectric material of this capacitor, TAM Corporation's dielectric material, Y5U-153U, which is of the Pb (Mg ⅓ Nb ⅔)O$_3$-based, lead-perovskite structure and has a particle size of 1.5 μm in average was used. The dielectric material thus obtained was mixed as the inorganic composition with a polyvinyl butyral polymer to be used as the organic binder, di-n-butyl phthalate to be used as the plasticizer and toluene to be used as the solvent so as to provide the composition shown in Table 13 in the form of a slurry. The slurry composition thus obtained was coated on an organic film to form a layer thereon by the doctor blade method, thus preparing a green tape being prepared. The thickness of the green tape was about 30 μm after being dried.

Next, the conductor paste to be used in this EXAMPLE was manufactured by adding the G-10 glass frit used in EXAMPLE 1 at an amount of 3 wt. % to CuO (having a particle size of 2.5 μm in average) thereby to make a CuO paste using the mixture thus obtained as the inorganic composition.

The CuO paste thus manufactured was printed to pattern an inner electrode on the dielectric green tape mentioned above by the screen printing method. The dielectric green tape was adheredly fixed on the conductor pattern thus formed, and a conductor pattern was printed further thereon so as to provide a confronting electrode thereto. These processes were repeatedly carried out to obtain a desired multilayer. Thereafter, a thermal press was used at 80° C. to apply a pressure of 120 kg/mm$^2$ on the multilayered body thus obtained to achieve a thermal adhesion. In this EXAMPLE, six electrodes were patterned by the printing method and five layers were effective between them.

The size of electrodes confronting each other were individually 2×2 mm and the thicknesses of the effective layers were individually 20 μm. The multilayered body thus prepared was cut in a predetermined size (3×4 mm). After cutting, it was undergone the binder removing, reduction and firing processes according to the operational profile shown in FIG. 3. External electrodes were formed on the multilayer capacitor thus obtained. The external electrode paste to be used here was the E.I. Du Pont's copper paste (#6001) which was fired at 600° C. in a nitrogen gas atmosphere.

The results thus processed exhibited suitable values to be used in MLC's in that a dielectric constant of about 8000, an insulation resistance (IR) of $4.2 \times 10^{12}$ Ω·cm and a tan δ of 1.4% (1 KHz) were obtained.

The observations of inner electrodes thus formed revealed that no crack and no delamination existed on its cut faces. Also, the examinations on the humidity resistance under the evaluation conditions such as 85° C.-85% RH and 50 V bias revealed that no deterioration (over 500 hours) and no generation of migration resulted. Therefore, the multilayered ceramic capacitor thus produced can be said to be high in reliability.

TABLE 13

Dielectric slurry composition

| | |
|---|---|
| Inorganic composition (TAM Y5U-153U) | 100 part |
| Polyvinyl butyral polymer | 25 part |
| Di-n-butyl phthalate | 5 part |
| Toluene | 40 part |

EXAMPLE 6

Figure 5:
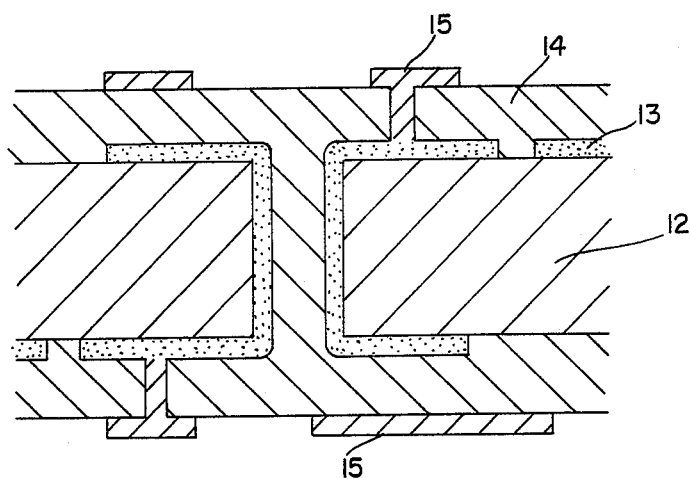
FIG. 5 is a secional view showing an embodiment of a thick film multilayered substrate according to this invention.

Next, an example showing the manufacture of a thick film multilayered substrate using the conductor composition of this invention, which is shown in FIG. 5 in cross-section, will be described. In FIG. 5, the reference numeral 12 indicates an alumina substrate (96% Al$_2$O$_3$) having a through-hole. The screen process printing was made on the surface of this alumina substrate using the CuO paste of this invention. In this case, the paste thus applied was infilterated into the through-hole thereby to form a CuO composition film on the inner surface of the hole. After being dried at 120° C. for ten minutes, the CuO paste of this invention was applied on the opposite face of the substrate by the screen printing method. The CuO conductor layers thus obtained were connected with each other between the both surfaces of the substrate via the through-hole as shown at 13 in FIG. 5.

Next, while screen-printing a dielectric past on either face of the substrate, the dielectric paste was infilterated into the through-hole to fill up with it as shown at 14 in FIG. 5. The dielectric paste to be used in this EXAMPLE was prepared by kneading the same mixture of glass and alumina as in EXAMPLE 1 as the inorganic composition and an ethyl cellulose polymer dissolved with turpentine oil as the vehicle composition using the 3-stage roll.

The substrate thus obtained was fired according to the operational profile shown in FIG. 3. To the substrate, thus fired, was printed a top layer thereon, using the E.I. Du Pont's copper paste, #9153 as shown at 15 in FIG. 5 and dried. Thereafter, it was fired at 900° C. for 60 minutes in a nitrogen gas atmosphere.

The thick film multilayered substrate obtained through the above mentioned processes can have a conductor film 13 which is coated with a dielectric layer 14 formed into the through-hole without disconnection as shown in FIG. 5. Thus, the wiring can be effected on the inner surface of a through-hole, which is suitable for the multification and densification. In addition, this EXAMPLE used an alumina substrate, but it is needless to say that a substrate having any of BeO, AlN, SiC and MgAl$_2$O$_4$ as the main component can be effectively used.

What is claimed is:

1. A conductor composition consisting essentially of an inorganic component and an organic vehicle, wherein said inorganic component consists essentially of 85 to 99.5 weight % of powdered CuO, and 0.5 to 15 weight % of at least one member selected from the groups consisting of powdered PbO-based glass comprising 5 to 70 weight % of PbO, powdered $Bi_2O_3$-based glass comprising 5 to 60 weight % of $Bi_2O_3$, powdered CuO-based glass comprising 1 to 30 weight % of CuO, and powdered $CuAl_2O_4$.

2. A conductor composition as claimed in claim 1, wherein said inorganic component comprises said powdered CuO at a weight percent of 85 to 99.5 and said powdered PbO-based glass at a weight percent of 0.5 to 15.

3. A conductor composition as claimed in claim 1, wherein said inorganic component comprises said powdered CuO at a weight percent of 85 to 99.5 and said powdered $Bi_2O_3$-based glass at a weight percent of 0.5 to 15.

4. A conductor composition claimed in claim 1 wherein said inorganic composition contains said powdered CuO at a weight percent of 85 to 99.0 and said powdered CuO-based glass at a weight percent of 1 to 15.

5. A conductor composition as claimed in claim 1, wherein said inorganic component comprises said powdered CuO at a weight percent of 85 to 99.5 and said powdered $CuAl_2O_4$ at a weight percent of 0.5 to 15.

6. A conductor composition as claimed in claim 1, wherein said PbO-based glass comprises PbO at 5 to 70 weight %, $B_2O_3$ at 0.5 to 30 weight %, $Al_2O_3$ at 0.1 to 15 weight %, MgO at 0 to 5 weight %, $ZrO_2$ at 0 to 5 weight %, $Y_2O_3$ at 0 to 3 weight % and SrO at 0 to 3 weight %.

7. A conductors composition as claimed in claim 1, wherein said $Bi_2O_3$-based glass comprises $Bi_2O_3$ at 5 to 60 weight %, PbO at 1 to 40 weight %, $B_2O_3$ at 0.5 to 20 weight %, $SiO_2$ at 0.1 to 20 weight %, MgO at 0 to 5 weight %, $ZrO_2$ at 0 to 5 weight %, $Y_2O_3$ at 0 to 3 weight % and SrO at 0 to 3 weight %.

* * * * *